(12) United States Patent
Fukui et al.

(10) Patent No.: US 8,913,389 B2
(45) Date of Patent: Dec. 16, 2014

(54) HEAT RADIATION DEVICE AND ELECTRONIC EQUIPMENT USING THE SAME

(75) Inventors: Yasuhito Fukui, Osaka (JP); Takashi Sawa, Shiga (JP); Shinichi Shinohara, Nara (JP)

(73) Assignee: Panasonic Corporation, Osaka (JP)

( * ) Notice: Subject to any disclaimer, the term of this patent is extended or adjusted under 35 U.S.C. 154(b) by 170 days.

(21) Appl. No.: 13/516,135

(22) PCT Filed: Feb. 3, 2011

(86) PCT No.: PCT/JP2011/000604
§ 371 (c)(1),
(2), (4) Date: Jun. 14, 2012

(87) PCT Pub. No.: WO2011/096218
PCT Pub. Date: Aug. 11, 2011

(65) Prior Publication Data
US 2012/0300406 A1 Nov. 29, 2012

(30) Foreign Application Priority Data

Feb. 4, 2010 (JP) ................................. 2010-022941
Feb. 4, 2010 (JP) ................................. 2010-022942

(51) Int. Cl.
*H05K 7/20* (2006.01)
*H01L 23/367* (2006.01)
*H01L 23/40* (2006.01)

(52) U.S. Cl.
CPC .......... *H01L 23/367* (2013.01); *H01L 23/4006* (2013.01)
USPC ............ 361/710; 361/707; 174/548; 257/722

(58) Field of Classification Search
USPC ........................ 361/676–678, 679.46–679.54, 361/688–722, 831
See application file for complete search history.

(56) References Cited

U.S. PATENT DOCUMENTS 4,964,458 A * 10/1990 Flint et al. .................... 165/80.4
5,168,348 A * 12/1992 Chu et al. ...................... 257/713

(Continued)

FOREIGN PATENT DOCUMENTS

CN        2810113 Y      8/2006
CN     101500372 A       8/2009

(Continued)

OTHER PUBLICATIONS

International Search Report issued in International Patent Application No. PCT/JP2011/000604 dated Apr. 12, 2011.
English Translation of Chinese Search Report issued in Chinese Patent Application No. CN 201180008307.0 dated Jun. 27, 2014.

*Primary Examiner* — Courtney Smith
(74) *Attorney, Agent, or Firm* — McDermott Will & Emery LLP

(57) ABSTRACT

Disclosed is a heat radiation device, which is in contact with a first heat-producing component having a higher value of guaranteed temperature and a second heat-producing component having a lower value of guaranteed temperature, and the heat radiation device comprises a metal member provided with a slit. The metal member is divided by the slit to have two heat radiation regions, a first heat radiation region and a second heat radiation region that are loosely coupled with each other in terms of heat conduction. The first heat-producing component is placed in contact with the first heat radiation region, and the second heat-producing component is placed in contact with the second heat radiation region.

8 Claims, 10 Drawing Sheets

(56) References Cited

U.S. PATENT DOCUMENTS

| | | | |
|---|---|---|---|
| 5,424,580 A * | 6/1995 | Tustaniwskyj et al. | 257/713 |
| 5,525,835 A * | 6/1996 | Nishiguchi | 257/712 |
| 5,930,115 A * | 7/1999 | Tracy et al. | 361/704 |
| 6,466,441 B1 * | 10/2002 | Suzuki | 361/695 |
| 6,979,899 B2 * | 12/2005 | Edwards | 257/704 |
| 7,019,973 B2 * | 3/2006 | Rivera | 361/700 |
| 7,382,616 B2 * | 6/2008 | Stefanoski | 361/698 |
| 7,755,895 B2 * | 7/2010 | Ikeda | 361/704 |
| 8,421,217 B2 * | 4/2013 | Casey et al. | 257/704 |
| 8,611,091 B2 * | 12/2013 | Guo et al. | 361/708 |
| 2005/0231925 A1 * | 10/2005 | Fukuda et al. | 361/760 |
| 2006/0279933 A1 | 12/2006 | Lee et al. | |
| 2008/0191325 A1 | 8/2008 | Shirasaka | |
| 2010/0246125 A1 * | 9/2010 | Okutsu | 361/695 |
| 2011/0012255 A1 * | 1/2011 | Suganuma | 257/712 |

FOREIGN PATENT DOCUMENTS

| | | |
|---|---|---|
| JP | 01-293548 | 11/1989 |
| JP | 10-041440 | 2/1998 |
| JP | 11-318695 | 11/1999 |
| JP | 2002-141451 | 5/2002 |
| JP | 2002-289750 | 10/2002 |
| JP | 2002-290085 | 10/2002 |
| JP | 2005-041813 | 2/2005 |
| JP | 2005-311230 | 11/2005 |
| JP | 2008-187101 | 8/2008 |
| JP | 2008-210854 | 9/2008 |

* cited by examiner

HEAT RADIATION DEVICE AND ELECTRONIC EQUIPMENT USING THE SAME

RELATED APPLICATIONS

This application is the U.S. National Phase under 35 U.S.C. §371 of International Application No. PCT/JP2011/000604, field on Feb. 3, 2011, which in turn claims the benefit of Japanese Application Nos. 2010-022942, field on Feb. 4, 2010, and 2010-022941, field on Feb. 4, 2010, the disclosures of which Applications are incorporated by reference herein.

TECHNICAL FIELD

The present application relates to a heat radiation device capable of radiating heat of a plurality of heat-producing components (e.g., semiconductors) mounted on a printed circuit board, and the application specifically relates to a heat radiation device provided with a heat separation slit.

BACKGROUND ART

A conventional printed circuit board has a plurality of heat-producing components (e.g., semiconductors) mounted on it. These heat-producing components are specified with their permissible operating temperatures, but the actual operating temperatures often exceed the permissible temperatures due to their own heat and thermal influence of the adjacent heat-producing components. It is necessary for this reason to dissipate heat of the heat-producing components using a heat radiation device. One example of such device is a heat sink 603 of a shape having a plurality of heat dissipating fins made by extrusion of a metal material such as aluminum, which is placed in contact with heat-producing components 602a and 602b to radiate the heat of heat-producing components 602a and 602b, as shown in FIG. 8.

FIG. 8 is a perspective view showing the structure of the conventional heat radiation device, in which heat-producing components 602a and 602b such as transistors of a power amplifier circuit are fixed with screws to heat sink 603 serving as the heat radiation device through an insulating material (not shown). Heat sink 603 is fixed to a chassis (not shown) disposed within enclosure 601.

Heat sink 603 is normally casted with aluminum or the like material, and provided with a plurality of fins 603a. The heat generated by heat-producing components 602a and 602b heats up heat sink 603, which produces the phenomenon of natural convection through a ventilator (not shown) or vent openings 604a and 604b formed in bottom plate 601a and top plate 601b of enclosure 601 where heat sink 603 is mounted, and introduces outside air from vent opening 604a in bottom plate 601a as indicated by an arrow. In this conventional heat radiation device, the heat generated by heat-producing components 602a and 602b flows out of vent opening 604b in top plate 601b as indicated by another arrow. As illustrated, the conventional heat radiation device uses a natural air-cooling method.

This kind of conventional heat radiation method is effective when power consumption of heat-producing components 602a and 602b is small, and there are no other heat-producing components in the vicinity of them (refer to patent literature 1 for example).

On the other hand, printed circuit boards keep following the trail of downsizing in addition to continuous increase in power consumption of the heat-producing components (e.g., semiconductors) in line with advancement of their functions. For this reason, heat-producing components are disposed as close as several millimeters to one another on a printed circuit board. As a result, temperature of certain heat-producing components rises above their permissible operating temperatures due to thermal influences of other heat-producing components located in the vicinity thereof and operating at higher temperatures by several tens of degrees Celsius.

Traditionally, this problem has been dealt with by providing a heat sink in contact only with the heat-producing components whose operating temperature exceed their permissible operating temperatures, and lowering the operating temperatures of these heat-producing components. However, due to a closely arranged condition of heat-producing components, it may become necessary to take additional measures. For example, to lower the ambient temperature of the heat-producing components having temperature rise above their permissible operating temperatures, at the same time it may become necessary to dissipate the heat of other adjacent heat-producing components whose operating temperatures are higher by several tens of degrees Celsius.

It is desirable in this case to fix one each of heat sinks to the individual heat-producing components. However, it becomes difficult to mount such heat sinks that have sufficient heat radiating areas required for cooling since the heat-producing components are placed close to one another. A method conceivable to cool the plurality of heat-producing components is to use heat sink 719 of a single-piece structure that is large enough to cover the plurality of heat-producing components 713 and 714, which are the targets of heat dissipation, and mount the heat sink 719 in a position astride both of heat-producing components 713 and 714 as shown in FIGS. 9A and 9B.

In FIGS. 9A and 9B, heat-producing component (e.g., a semiconductor) 714 is assumed to have a safety margin of only several degrees Celsius against the permissible operating temperature. As a result, it is necessary to decrease the ambient temperature by lowering operating temperature of adjacent heat-producing component (e.g., a semiconductor) 713 in addition to dissipating heat of heat-producing component 714 in order to keep the operating temperature within the tolerable level. As shown in FIGS. 9A and 9B, the method is to make heat-producing components 713 and 714 in contact with heat sink 719 of aluminum in a shape including a plurality of fins, through heat conductive rubber 720 to dissipate the heat. Aluminum generally has a thermal conductivity of about 200 to 300 W/(m·K).

Distribution of heat in conventional heat sink 719 of this structure is shown in FIG. 10, which illustrates heat sink 719, heat-producing components 713 and 714, other components 730 and 731 on printed circuit board 711, and temperature measurement points a2, b2, c2 and d2. FIG. 10 also shows temperature values measured at individual temperature measurement points a2, b2, c2 and d2. As shown in FIG. 10, the heat is distributed generally uniformly throughout conventional heat sink 719, as the temperatures are about 57° C. throughout all the measurement points a2, b2, c2 and d2. However, heat-producing component 714 which has the margin of only several degrees Celsius against the permissible operating temperature may breakdown since the operating temperature of 57° C. exceeds the permissible temperature of 55° C. of the heat-producing component 714.

To this end, the conventional method of dissipating the heat from heat-producing components 713 and 714 presents a problem in that the temperature of heat sink 719 exceeds the permissible operating temperature of heat-producing component 714 having the margin of only several degrees C. against the permissible operating temperature when both of heat-producing components 713 and 714 of different permissible operating temperatures and power consumptions are cooled with single heat sink 719.

Although it is conceivable to increase a surface area of heat sink 719 or to extend a height of the fins to bring down the temperature of heat-producing component 714 to the permissible operating temperature or below, this is difficult due to design requirements of printed circuit board 711.

CITATION LIST

Patent Literature

PTL 1: Unexamined Japanese Patent Publication No. 2002-141451

SUMMARY OF THE APPLICATION

The present application relates to a heat radiation device, which is in contact with a first heat-producing component having a higher value of guaranteed temperature and a second heat-producing component having a lower value of guaranteed temperature, and the heat radiation device includes a metal member provided with a slit. The metal member is divided by the slit into two heat radiation regions, namely a first heat radiation region and a second heat radiation region that are loosely coupled with each other in terms of heat conduction. The first heat radiation region of the metal member is in contact with the first heat-producing component, and the second heat radiation region of the metal member is in contact with the second heat-producing component.

On a printed circuit board having a plurality of closely mounted heat-producing components, it becomes possible by virtue of this structure to dissipate heat with preference given to any of the heat-producing components having a smaller margin of permissible operating temperature.

An electronic equipment of the present application is provided with a heat radiation device. The heat radiation device includes a metal member provided with a slit and being in contact with a first heat-producing component having a high value of guaranteed temperature and a second heat-producing component having a low value of guaranteed temperature. The metal member is divided by the slit into two heat radiation regions, namely a first heat radiation region and a second heat radiation region that are loosely coupled with each other in terms of heat conduction. The first heat radiation region of the metal member is in contact with the first heat-producing component, and the second heat radiation region of the metal member is in contact with the second heat-producing component.

DETAILED DESCIRPTION

First Exemplary Implementation

Figure 1:
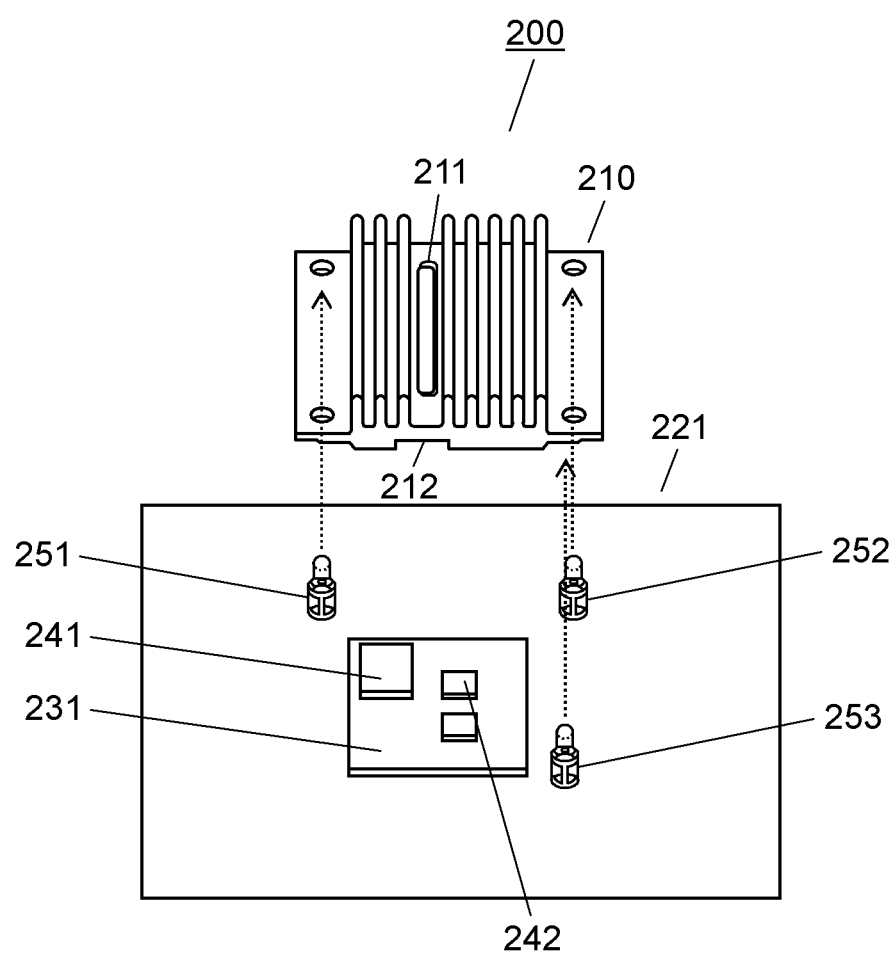
FIG. 1 is a perspective view showing a diagrammatic structure of a heat radiation device according to a first exemplary implementation of the present application.

Description is provided hereinafter of an exemplary implementation of the present application with reference to the accompanying drawings. FIG. 1 is a perspective view showing a diagrammatic structure of heat radiation device 200 according to the first implementation of this application.

In FIG. 1, heat radiation device 200 used in electronic equipment has heat sink 210, which is a metal member provided with an opening formed by slit 211 therein. Heat sink 210 is in contact with first heat-producing component 241 and second heat-producing component 242 on semiconductor 231 mounted on printed circuit board 221. Heat sink 210 dissipates heat generated by first heat-producing component 241 and second heat-producing component 242.

Heat sink 210 is casted with aluminum or the like material, and provided with a plurality of fins formed in parallel. Heat sink 210 is also provided with slit 211 between groups of the fins, so that it has a shape comprising two heat radiation regions that are connected to each other only with end portions. In other words, the metal member is divided by slit 211 into two heat radiation regions, namely a first heat radiation region and a second heat radiation region that are loosely coupled with each other in terms of heat conduction. The two heat radiation regions of heat sink 210 are brought into contact with first heat-producing component 241 and second heat-producing component 242 having different temperature guarantee values for dissipation of their heat. Heat sink 210 is disposed and secured to printed circuit board 221 with fixing parts 251, 252 and 253.

Description is provided here about the meaning of the expression of "loosely coupled in terms of heat conduction". The first heat radiation region and the second heat radiation region are so formed that they are adjacent to each other. Suppose that heat sink 210 is not provided with slit 211, exchange of the heat occurs swiftly between the first heat radiation region and the second heat radiation region. This is because the closer the distance between the first heat radiation region and the second heat radiation region the faster the speed of the heat to move from one heat radiation region to the other, since the heat travels directly through a path of the aluminum having high thermal conductivity. As a result, it is highly likely that a state of thermal equilibrium is attained between the first heat radiation region and the second heat radiation region. On the other hand, when heat sink 210 is provided with slit 211 as in the case of this implementation, exchange of the heat does not progress so swiftly between the first heat radiation region and the second heat radiation region. This is because slit 211 breaks the path for the heat to travel through. For example, the heat of the first heat radiation region detours around slit 211 and does not reach the second heat radiation region. As a result, it is unlikely that a state of thermal equilibrium is attained between the first heat radiation region and the second heat radiation region.

In concluding the difference stated above, it is a change in length (i.e., thermal conductivity) of the path for the heat traveling between the first heat radiation region and the second heat radiation region that occurs before and after formation of slit 211. As described, the loose coupling of heat conduction represents a state of relatively low thermal conductivity resulting from formation of slit 211.

First heat-producing component 241 is disposed on semiconductor 231, and it has a permissible temperature value of 100° C. Second heat-producing component 242 is also disposed on semiconductor 231, and it has a permissible temperature value of 80° C. The first heat radiation region on the metal member of heat radiation device 200 is in contact with first heat-producing component 241 having the higher value of permissible temperature. The second heat radiation region on the metal member of the heat radiation device 200 is in contact with second heat-producing component 242 having the lower value of permissible temperature than the permissible temperature value of heat-producing component 241.

Slit 211 formed in heat sink 210 makes the two heat radiation regions of heat sink 210 to dissipate the heat of first heat-producing component 241 and second heat-producing component 242 independently. As a result, the effect of heat sink 210 equalizing the temperature distribution between the first heat-producing component 241 and the second heat-producing component 242 becomes smaller. To this end, temperatures recorded on the first heat-producing component 241 and the second heat-producing component 242 were found to be 93° C. and 77° C., respectively. In other words, the temperatures of first heat-producing component 241 and second heat-producing component 242 can be kept below their permissible values of 100° C. and 80° C. Accordingly, heat sink 210 can maintain the permissible temperature values of both first heat-producing component 241 and second heat-producing component 242.

In addition, heat sink 210 is so constructed that a larger area is assigned for second heat-producing component 242 of the lower value of permissible temperature than first heat-producing component 241 of the higher value of permissible temperature, as shown in FIG. 1, when making slit 211 to divide heat sink 210 into the two heat radiation regions. As a result, a heat dissipating capacity of the second heat radiation region is set higher than that of the first heat radiation region. As a result, a temperature of second heat-producing component 242 having the lower value of permissible temperature can be further reduced as compared to a case in which heat sink 210 is divided equally into two heat radiation regions with slit 211.

According to the above structure, heat radiation device 200 having the heat sink with a plurality of heat-producing components mounted thereto is characterized by slit 211 provided between fins for impeding equalization of temperature distribution over heat radiation device 200, and it thereby enables single heat sink 210 to dissipate heat of the plurality of heat-producing components, which can reduce a number of component parts and associated cost.

In this exemplary implementation, although heat sink 210 has been shown as having slit 211, it may be equally effective to form thin portion 212 in heat sink 210 in order to divide it into two heat radiation regions. It was found in this case that the heat radiation region can be divided effectively by reducing the thickness of heat sink 210 from 5 mm to 2 mm. It is even more effective to divide the heat radiation region by providing thin portion 212 in heat sink 210 in addition to slit 211 as illustrated in FIG. 1. In other words, the metal member of heat sink 210 may have thin portion 212 formed by reducing the thickness of heat sink 210 and thin portion 212 includes slit 211.

In the case of heat sink 210, the metal member is provided with the fins divided into two groups as shown in FIG. 1, and a number of the fins formed in the second heat radiation region can be greater than that of the first heat radiation region. It becomes possible in this manner to further increase the heat dissipating capacity of the second heat radiation region, and reduce the temperature of second heat-producing component 242 having the lower value of permissible temperature.

Figure 2:
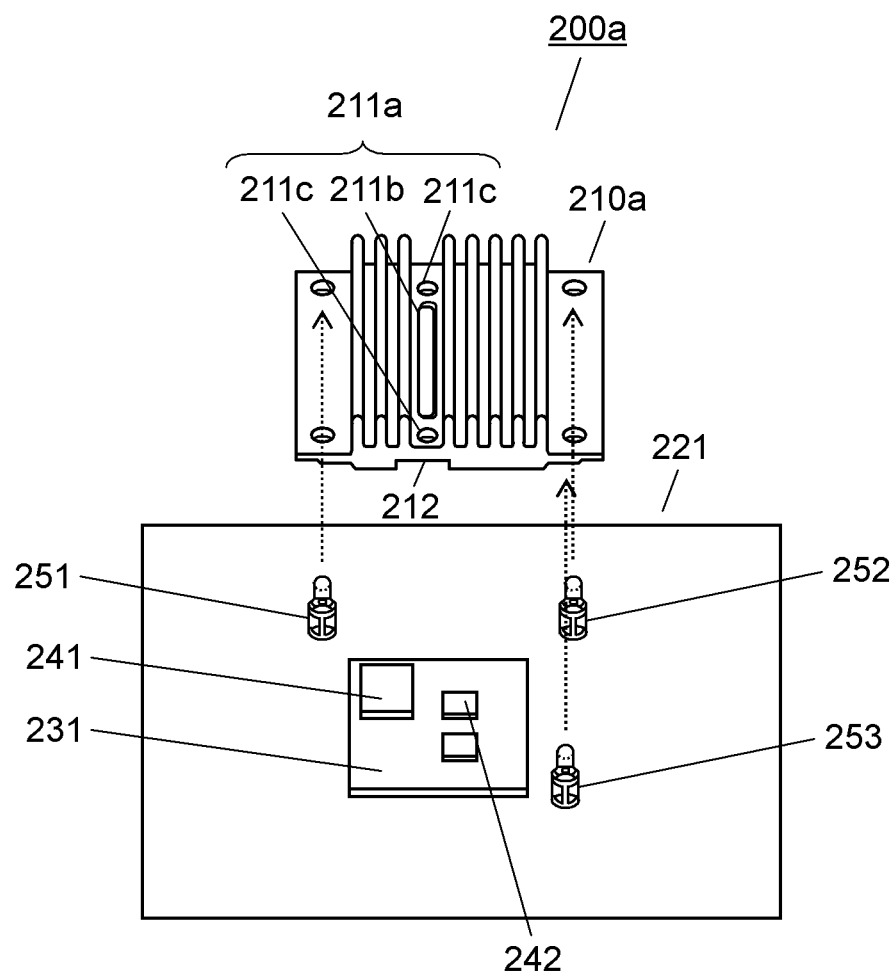
FIG. 2 is a perspective view showing a diagrammatic structure of another heat radiation device according to the first exemplary implementation of the present application.

It is also practical to compose slit 211a with a combination of slit 211b and holes 211c as shown in FIG. 2. FIG. 2 is a perspective view showing a diagrammatic structure of another heat radiation device 200a according to the first exemplary implementation of this application. In FIG. 2, slit 211a comprises slit 211b and two holes 211c. Although slit 211a is illustrated as being formed in thin portion 212, it is not necessary to have thin portion 212, and single heat sink 210a is still capable of dissipating heat of the plurality of heat-producing components while also achieving reduction of the number of component parts and the cost associated therewith.

Although the structure shown in FIG. 2 uses two holes 211c, the number of holes 211c can be more or less than two. In addition, slit 211a may be formed by a plurality of slits 211b. The plurality of slits 211b may be formed separately such that each slit has at least a hole or a slit.

The surface of heat sink 210 may be blackened to improve radiating efficiency of the heat. In this case, overall temperature of heat sink 210 can be reduced by 2 to 4° C.

Second Exemplary Implementation

The second exemplary implementation of the present application represents a structure comprising a heat conductive member placed between a heat sink and heat-producing components in order to allow for better contact between the heat sink and the heat-producing components. Description of other structural components is skipped since they are similar to those of the first exemplary implementation of the application.

Figure 3:
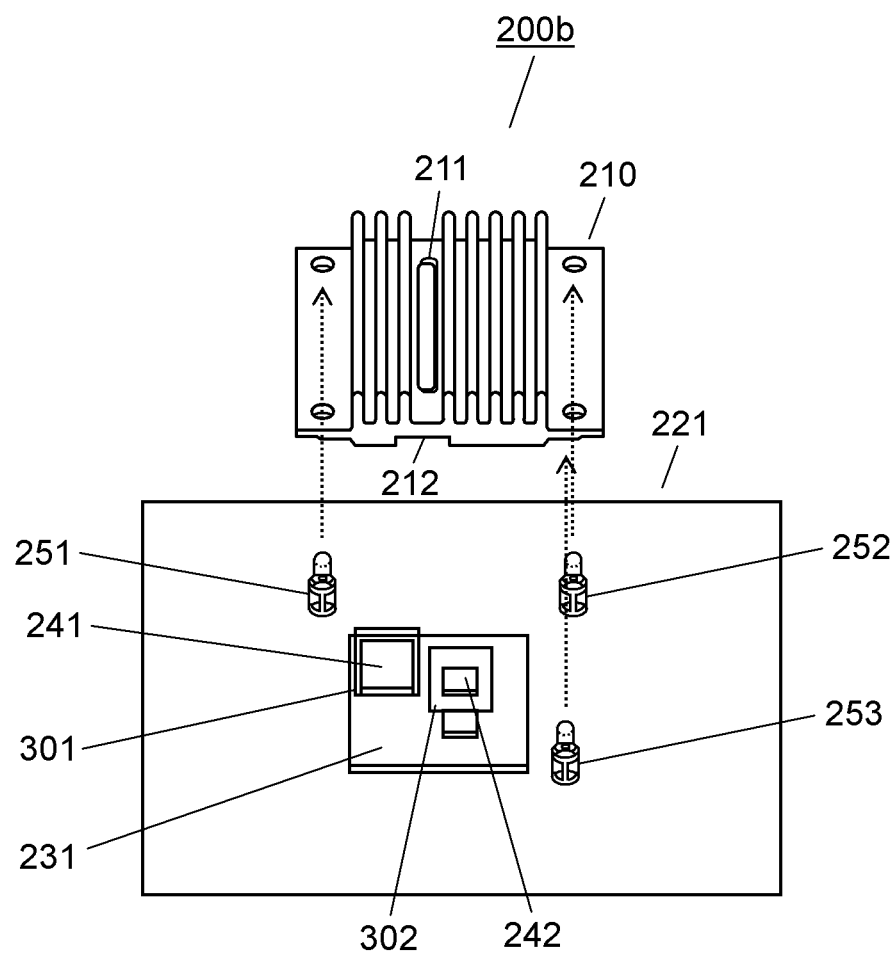
FIG. 3 is a perspective view showing a diagrammatic structure of a heat radiation device according to a second exemplary implementation of the present application.

FIG. 3 is a perspective view showing a diagrammatic structure of heat radiation device 200b according to the second exemplary implementation of this application. Heat conductive rubber 301 in FIG. 3, designated as a first heat conductive member, is placed between heat sink 210 and first heat-producing component 241. Heat conductive rubber 302, designated as a second heat conductive member is placed between heat sink 210 and second heat-producing component 242. In other words, heat radiation device 200b of this implementation includes heat sink 210, heat conductive rubber 301 in contact with first heat-producing component 241 and the metal member, and heat conductive rubber 302 in contact with second heat-producing component 242 and the metal member.

Heat conductive rubber 301 has a thermal conductivity of about 1 to 2 W/(m·K), and heat conductive rubber 302 has a thermal conductivity of 3 to 6 W/(m·K), for example. This means that the thermal conductivity of the first heat conductive member is made to be lower than that of the second heat conductive member.

Heat conductive rubber 301 placed between first heat-producing component 241 and heat sink 210 is made of a material having a thermal conductivity lower than a material used for heat conductive rubber 302 placed between second heat-producing component 242 and heat sink 210. This can increase amount heat transfer from second heat-producing component 242 of low permissible temperature value to heat sink 210 while decrease amount of heat transfer from first heat-producing component 241 of high permissible temperature value to heat sink 210.

In other words, heat conductive rubbers 301 and 302 are used to differentiate the thermal conductivities to heat sink 210 from first heat-producing component 241 and second heat-producing component 242. More specifically, heat conductive rubbers 301 and 302 are designed to make the efficiency of heat transfer from second heat-producing component 242 of the low permissible temperature value to heat sink 210 higher than the heat transfer from first heat-producing component 241 of the high permissible temperature value to heat sink 210. As a result, the possibility of heat sink 210 equalizing the temperature distribution between first heat-producing component 241 and second heat producing component 242 becomes even smaller. The temperatures recorded on first heat-producing component 241 and second heat-producing component 242 were found to be 94° C. and 75° C., respectively. In other words, the foregoing structure can ensure second heat-producing component 242 to have a larger margin against the permissible temperature value of 80° C.

According to the above structure, the heat radiation device for electronic equipment has a heat sink with a plurality of heat-producing components mounted thereto. The heat radiation device is capable of reliably dissipating heat of the heat-producing components through the heat conductive members placed in a manner to enable close contact between the heat-producing components and the heat radiation device. In addition, the structure can efficiently transfer the heat to the heat sink from the heat-producing component of lower permissible temperature value since the heat conductive member of lower thermal conductivity is used for the heat-producing component of higher permissible temperature value.

In this implementation, although the heat conductive members are placed only on top portions of the heat-producing components, as illustrated in FIG. 3, the heat conductive members may be so configured so that they cover all sides of the heat-producing components. Additionally, the heat conductive members may be kept in contact with the printed circuit board or may partially cover the sides of the heat-producing components. When this is the case, the heat conductive members can transfer the heat of the heat-producing components from their side surfaces to the heat radiation device. It also helps dissipate the heat by way of the printed circuit board.

In the present application, first heat-producing component 241 and second heat-producing component 242 have been described as being disposed on semiconductor 231 as shown in FIG. 1, FIG. 2 and FIG. 3. Alternatively, the present application is applicable even if first heat-producing component 241 and second heat-producing component 242 are mounted directly on printed circuit board 221.

Third Exemplary Implementation

Figure 4A:
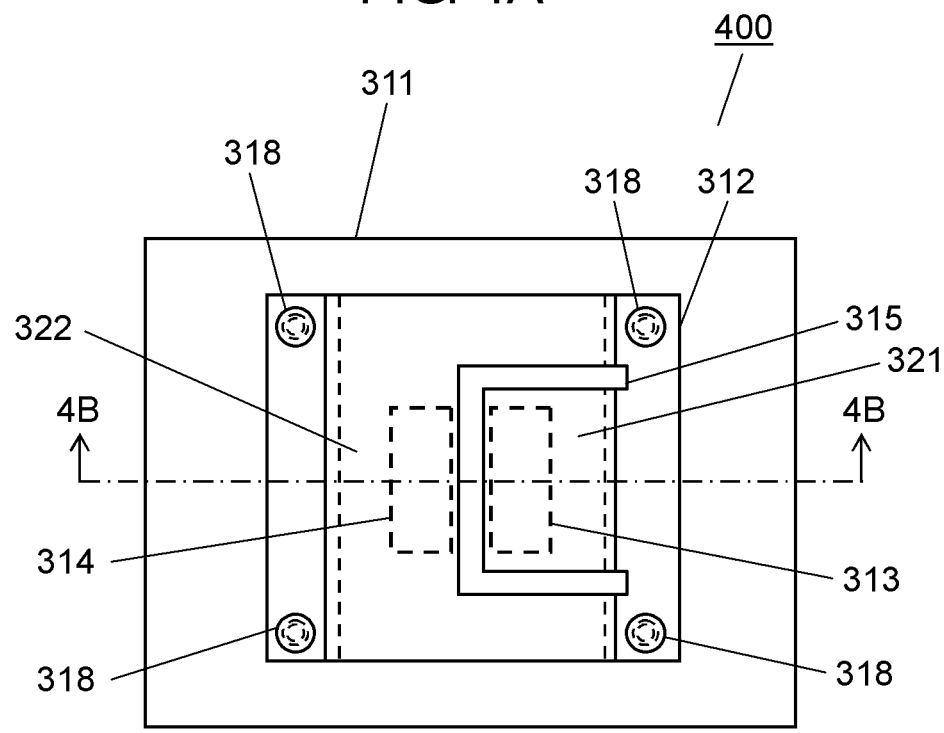
FIG. 4A is a front view showing a diagrammatic structure of a heat radiation device according to a third exemplary implementation of the present application.
Figure 4B:
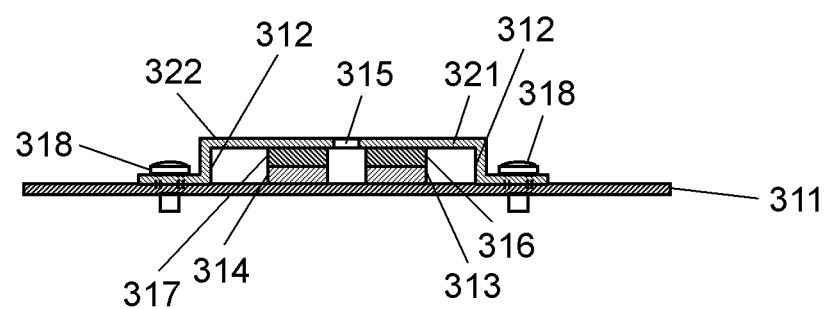
FIG. 4B is a sectional view showing the structure of the heat radiation device according to the third exemplary implementation of the application.
Figure 5:
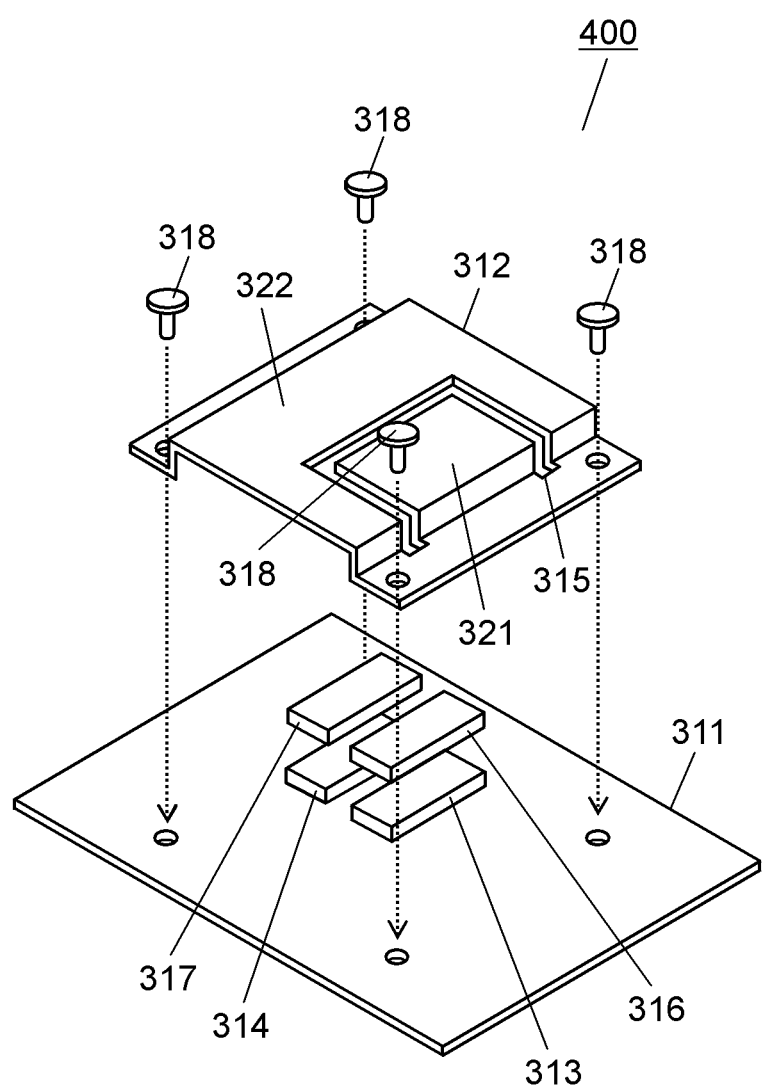
FIG. 5 is an exploded view showing the structure of the heat radiation device according to the third exemplary implementation of the application.

Description is now provided of a heat radiating structure of the third exemplary implementation of this application. FIG. 4A is a front view showing a diagrammatic structure of heat radiation device 400, and FIG. 4B is a sectional view showing the structure of heat radiation device 400 according to the third exemplary implementation of this application. FIG. 5 is an exploded view, also showing the structure of heat radiation device 400 according to this exemplary implementation.

As shown in FIGS. 4A, 4B and 5, first heat-producing component 313 and second heat-producing component 314 representing heat dissipating components such as, for example, semiconductors are mounted on printed circuit board 311. First heat-producing component 313 and second heat-producing component 314 are in contact with heat sink 312 made of a metal member through their respective heat conductive rubber 316 designated as a first heat conductive member and heat conductive rubber 317 designated as a second heat conductive member, to transfer heat to heat sink 312. Heat sink 312 is fixed to printed circuit board 311 with screws 318.

In the present implementation, heat sink 312 of heat radiation device 400 is a single-piece structure of 52.5 mm by 70 mm, a size suitable for mounting in a limited space of printed circuit board 311. Heat sink 312 is configured to have an opening formed by slit 315, which is shaped like letter U. Heat sink 312 is made of an iron material having a thermal conductivity of 70 to 100 W/(m·K). Heat sink 312 is divided by slit 315 to have two heat radiation regions, namely a first heat radiation region 321 and a second heat radiation region 322 that are loosely coupled in terms of heat conduction. Heat sink 312 is in contact with first heat-producing component 313 through heat conductive rubber 316 in first heat radiation region 321 located inside of the U-shaped slit 315. Heat sink 312 is also in contact with second heat-producing component 314 through second heat conductive rubber 317 in second heat radiation region 322 located outside of the U-shaped slit 315.

First heat-producing component 313 consumes about 7 W of electric power, and it has a margin of ten and several degrees Celsius against permissible operating temperature of 80° C. when a heat sink is not used.

Second heat-producing component 314 has a margin of several degrees Celsius against permissible operating temperature of 55° C. when the heat sink is not used, though it consumes only about 1 W of electric power.

A heat rise of second heat-producing component 314 is attributed to an increase in the ambient temperature due to the heat of first heat-producing component 313 in addition to the heat of second heat-producing component 314. This is because second heat-producing component 314 is located several millimeters away from first heat-producing component 313. The temperature of second heat-producing component 314 exceeds permissible operating temperature of 55° C. if heat sink 312 is not used.

Heat conductive rubber 316 is placed between first heat-producing component 313 and first heat radiation region 321 of heat sink 312 and is configured to transfer the heat of first heat-producing component 313 to heat sink 312. Heat conductive rubber 316 has a thermal conductivity of 1 to 2 W/(m·K).

Heat conductive rubber 317 is placed between second heat-producing component 314 and second heat radiation region 322 of heat sink 312, and it transfers the heat of second heat-producing component 314 to heat sink 312. Heat conductive rubber 317 has a thermal conductivity of 2 to 4 W/(m·K). Heat conductive rubber 317 helps dissipate the heat of second heat-producing component 314 more effectively since it has the thermal conductivity of approximately 2 times that of heat conductive rubber 316.

The heat of first heat-producing component 313 and second heat-producing component 314 is transferred in this manner to first heat radiation region 321 and second heat radiation region 322 of heat sink 312 through heat conductive rubber 316 and heat conductive rubber 317, respectively, and dissipated into air by thermal radiation from first heat radiation region 321 and second heat radiation region 322.

Description is provided next about heat transfer of heat radiation device 400 according to this implementation. Slit 315 of heat sink 312 is shaped such that it surrounds first heat-producing component 313 and such that second heat radiation region 322 for second heat-producing component 314 becomes larger than first heat radiation region 321 for first heat-producing component 313 when heat sink 312 is brought into contact with first heat-producing component 313 and second heat-producing component 314 through heat conductive rubbers 316 and 317.

The reason for securing a larger area of heat dissipation for second heat-producing component 314 is because second heat-producing component 314 has the margin of only several degrees Celsius against the permissible temperature. On the contrary, first heat-producing component 313 is provided with a smaller area of heat dissipation because it has the margin of ten and several degrees Celsius against the permissible temperature.

In the case of heat sink 312 having slit 315 of FIG. 4A, the heat produced by first heat-producing component 313 needs to detour around slit 315 of a given distance through heat sink 312 before reaching second heat-producing component 314, thereby resulting in a reduction of conducting heat.

Figure 6:
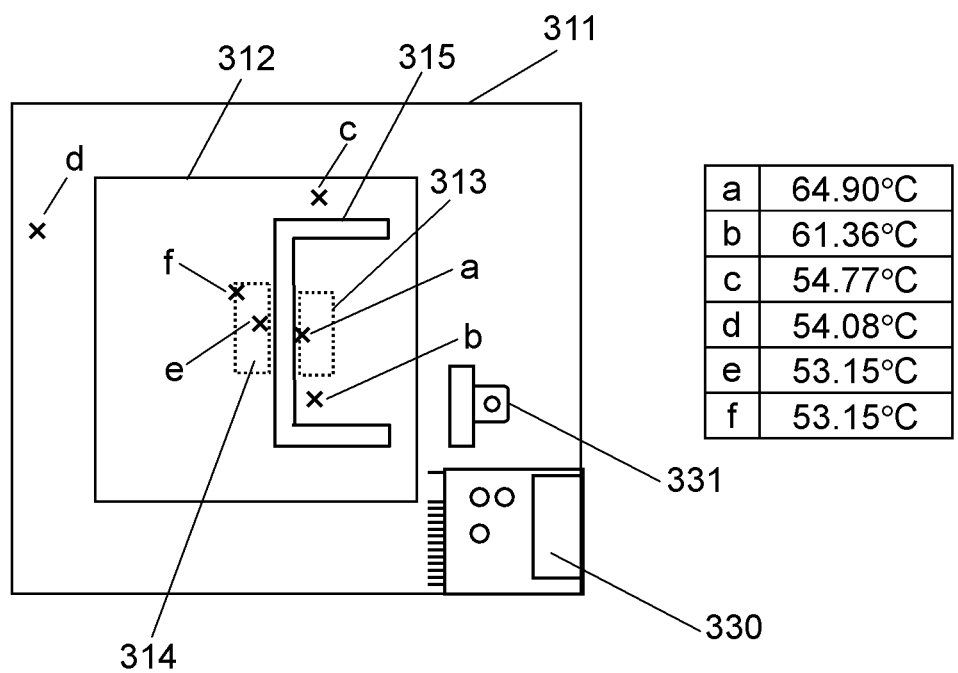
FIG. 6 shows a heat sink provided with a slit according to the third exemplary implementation of the application, and distribution of heat in and around the heat sink.

Description is provided next of a concrete example of heat distribution of heat sink 312 provided with slit 315 in this implementation. FIG. 6 shows heat sink 312 provided with slit 315 according to this third implementation of the application, and distribution of heat in and around heat sink 312. FIG. 6 illustrates heat sink 312, first heat-producing component 313, second heat-producing component 314, other components 330 and 331 on printed circuit board 311, and temperature measurement points a, b, c, d, e and f. FIG. 6 also shows actual temperature values measured at individual temperature measurement points a, b, c, d, e and f.

As shown in FIG. 6, distribution of temperature is not uniform between two regions separated by slit 315 when heat sink 312 is mounted on first heat-producing component 313 and second heat-producing component 314. That is, temperature of second heat radiation region 322 (at temperature measurement points e and f) located above second heat-producing component 314 is approximately 53° C., which is below the permissible operating temperature 55° C. of second heat-producing component 314. Temperature of first heat radiation region 321 (at temperature measurement point a) located above first heat-producing component 313 is approximately 65° C., which is also below the permissible operating temperature 80° C. of first heat-producing component 313. However, temperature of first heat radiation region 321 is higher than that of second heat radiation region 322 above second heat-produciing component 314.

It is by virtue of the above structure, in which the heat sink in contact with the plurality of heat-producing components is provided with the U-shaped slit, that temperatures of the individual heat-producing components can be kept below their permissible operating temperatures by separating heat of the individual heat-producing components and assigning a larger heat dissipating area to the heat-producing component having a smaller margin against its permissible operating temperature.

Although the slit shown in this implementation is shaped like the letter U, it can be any other shape such as the letter V or a semi-circular shape.

In this implementation, although the heat conductive rubbers are placed only on top portions of the heat-producing components as illustrated in FIG. 4B, the heat conductive rubbers may be so arranged as to cover all sides of the heat-producing components and kept in contact with the printed circuit board, or they partially cover the sides of the heat-producing components. When this is the case, the heat conductive rubbers can transfer the heat of the heat-producing components from their side surfaces to the heat radiation device. It also helps dissipate the heat by way of the printed circuit board.

Figure 7:
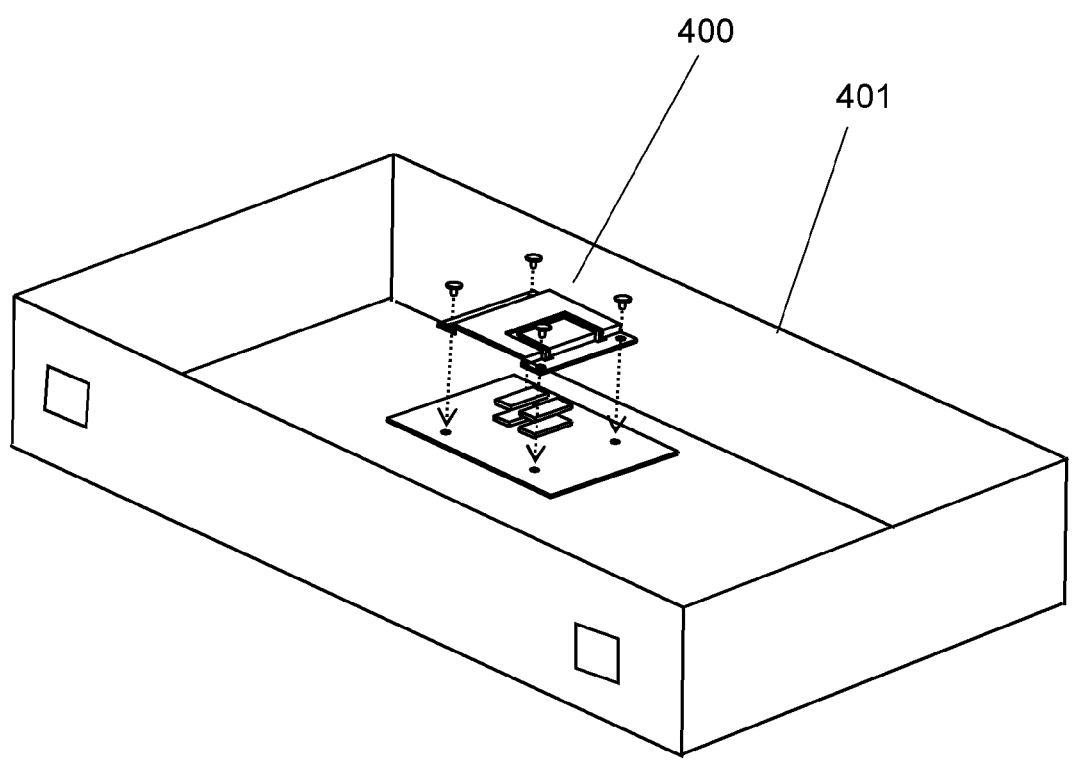
FIG. 7 is a conceptual diagram illustrating a structure of electronic equipment provided with a heat radiation device.
Figure 8:
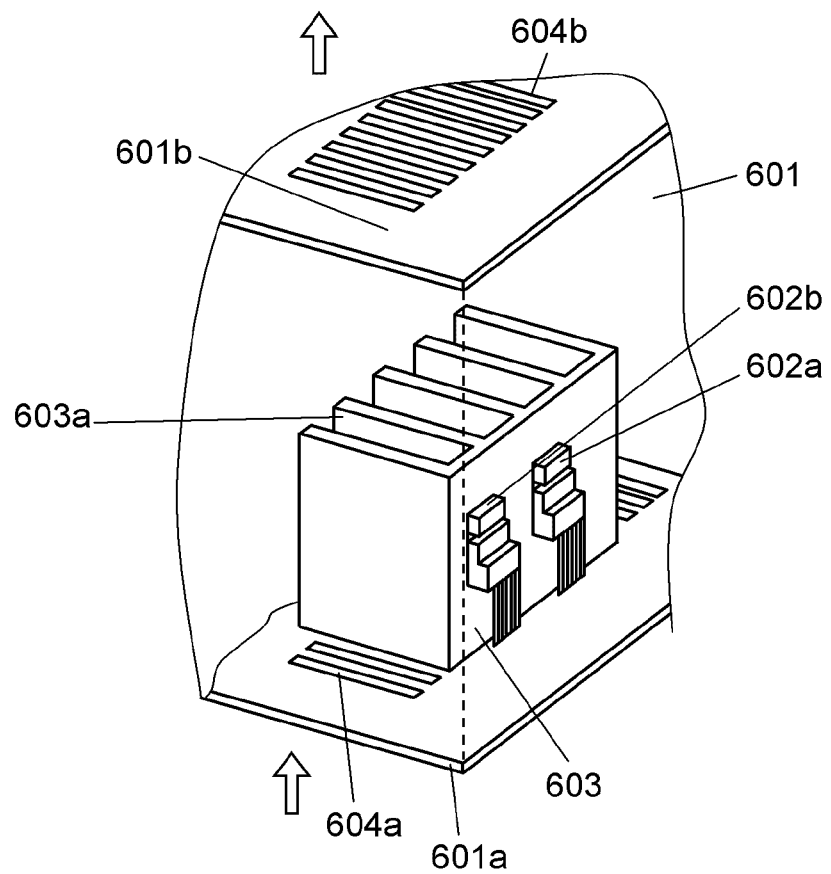
FIG. 8 is a perspective view showing a structure of a conventional heat radiation device.
Figure 9A:
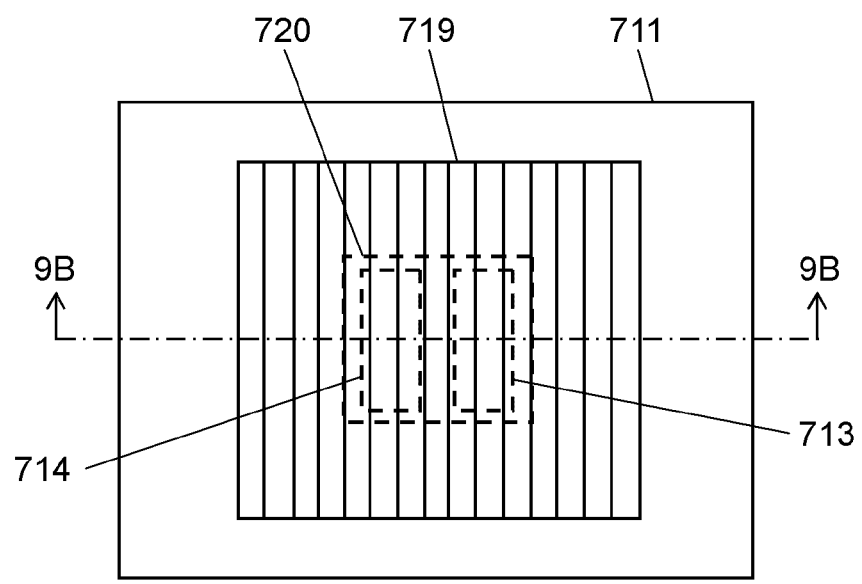
FIG. 9A is a plan view showing a general structure of a conventional heat sink provided with a plurality of heat dissipating fins.
Figure 9B:
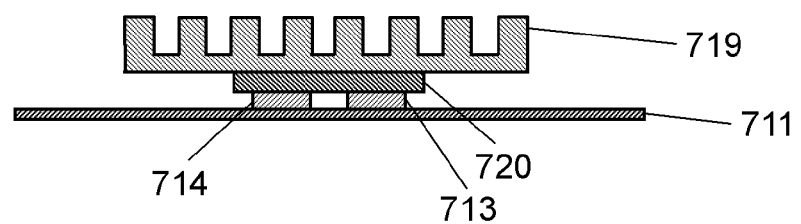
FIG. 9B is a sectional view showing the general structure of the conventional heat sink provided with the plurality of heat dissipating fins.
Figure 10:
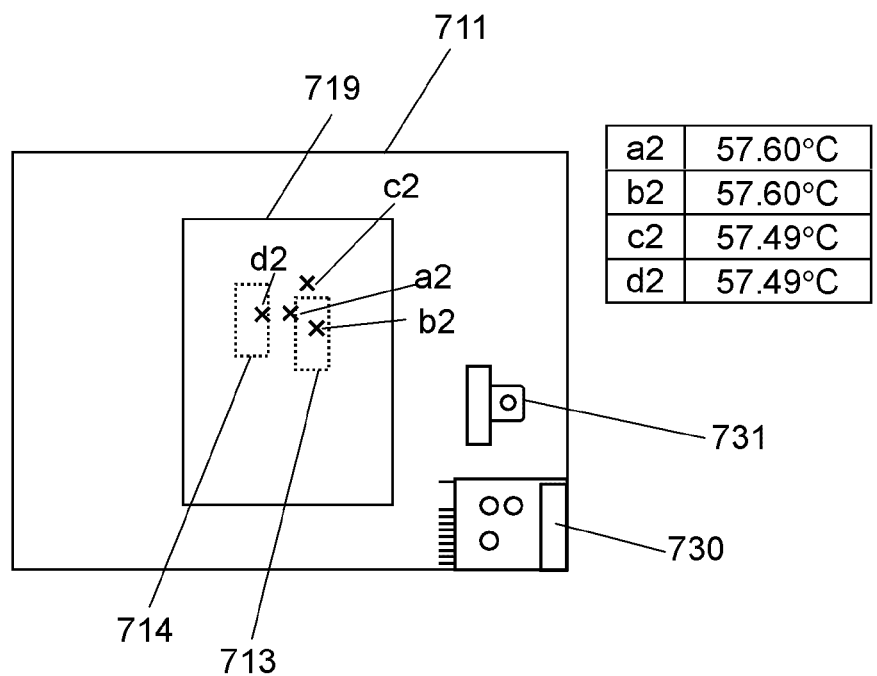
FIG. 10 shows distribution of heat in the conventional heat sink provided with the plurality of heat dissipating fins.

As described above, the heat sink provided with the slit according to this implementation is designed to closely simulate a plurality of independent heat sinks placed on individual heat-producing components while maintaining advantages of the single-piece configuration, thereby achieving the heat radiation device capable of cooling the plurality of heat-producing components (e.g., chip components) even when installation of a plurality of heat sinks is not possible. FIG. 7 is a conceptual diagram illustrating a structure of electronic equipment 401 provided with heat radiation device 400 described above. Heat radiation device 400 can be substituted with any of the heat radiation devices described in the first through the third exemplary implementations.

In other words, electronic equipment is provided with heat radiation device 400 comprising a metal member having an opening formed by a slit and being in contact with a first heat-producing component having a higher value of permissible temperature and a second heat-producing component having a lower value of permissible temperature. The metal member is divided by the slit into two heat radiation regions, namely a first heat radiation region and a second heat radiation region that are loosely coupled with each other in terms of heat conduction. The first heat radiation region of the metal member is in contact with the first heat-producing component, and the second heat radiation region of the metal member is in contact with the second heat-producing component.

When provided in electronic equipment 401, heat radiation device 400 can help realize high-density mounting of heat-producing components such as semiconductors of high heat-producing capacities. Thus achieved is the advancement of electronic equipment toward downsizing and high performance. The electronic equipment may include a display device, and this application is applicable to various consumer apparatuses including digital televisions, image-recording devices and the like.

Industrial Applicability

Heat radiation device and electronic equipment using the same according to the present application make possible a reduction in number of components and cost thereof, and they are therefore useful as heat radiation devices for dissipating heat of a plurality of electrical components.

REFERENCE MARKS IN THE DRAWINGS 200, 200a, 200b, 400 Heat radiation device
210, 210a Heat sink (metal member)
211, 211a, 211b Slit
211c Hole
212 Thin portion
221 Printed circuit board
231 Semiconductor
241 First heat-producing component
242 Second heat-producing component
251, 252, 253 Fixing part 301 Heat conductive rubber (first heat conductive member)
302 Heat conductive rubber (second heat conductive member)
311 Printed circuit board
312 Heat sink (metal member)
313 First heat-producing component
314 Second heat-producing component
315 Slit
316 Heat conductive rubber (first heat conductive member)
317 Heat conductive rubber (second heat conductive member)
318 Screw
321 First heat radiation region
322 Second heat radiation region
401 Electronic equipment

The invention claimed is:

1. A heat radiation device comprising a metal member provided with an opening, the opening dividing the metal member into a first heat radiation region and a second heat radiation region loosely coupled with each other in terms of heat conduction, wherein:
   the first heat radiation region is in contact with a first heat-producing component,
   the second heat radiation region is in contact with a second heat-producing component,
   a maximum allowable operating temperature of the first heat-producing component is higher than a maximum allowable operating temperature of the second heat-producing component,
   a heat dissipating capacity of the second heat radiation region is higher than a heat dissipating capacity of the first heat radiation region,
   the metal member includes one or more fins in each of the first and second heat radiation regions, and
   the second heat radiation region includes a greater number of fins than the first heat radiation regions.

2. The heat radiation device according to claim 1, wherein:
   the opening includes a slit, and
   the slit is formed in a portion of the metal member that is thinner than other portions of the metal member.

3. A heat radiation device according to claim 1, further comprising a plurality of holes, wherein the opening includes a plurality of slits spaced apart from the plurality of holes.

4. The heat radiation device according to claim 1, further comprising:
   a first heat conductive member in contact with the first heat-producing component and the metal member; and
   a second heat conductive member in contact with the second heat-producing component and the metal member, wherein
   a thermal conductivity of the first heat conductive member is smaller than a thermal conductivity of the second heat conductive member.

5. A heat radiation device according to claim 1, wherein:
   the opening includes a U-shaped slit,
   the first heat radiation region is located inside of the U-shaped slit, and
   the second heat radiation region is located outside of the U-shaped slit.

6. An electronic equipment comprising:
   a first heat-producing component having a first maximum allowable operating temperature;
   a second heat-producing component having a second maximum allowable operating temperature; and
   a heat radiation device including a metal member with an opening, the opening diving the metal member into a first heat radiation region and a second heat radiation region loosely coupled with each other in terms of heat conduction, wherein:
   the first heat radiation region is in contact with the first heat-producing component,
   the second heat radiation region is in contact with the second heat-producing component,
   the first maximum allowable operating temperature of the first heat-producing component is higher than the second maximum allowable operating temperature of the second heat-producing component,
   a heat dissipating capacity of the second heat radiation region is higher than a heat dissipating capacity of the first heat radiation region,
   the metal member includes one or more fins in each of the first and second heat radiation regions, and
   the second heat radiation region includes a greater number of fins than the first heat radiation regions.

7. An electronic component comprising:
   a heat radiation device having a first heat radiation portion and a second heat radiation portion that are loosely coupled with each other in terms of heat conduction, the first heat radiation portion and the second heat radiation portion having different heat dissipating capacities;
   a first heat-producing component in contact with the first heat radiation portion; and
   a second heat-producing component in contact with the second heat radiation portion, wherein:
   a maximum allowable operating temperature of the first heat-producing component is higher than a maximum allowable operating temperature of the second heat-producing component,
   the first heat radiation portion includes a first metal member and a first heat conductive member,
   the second heat radiation portion includes a second metal member and a second heat conductive member, and
   a thermal conductivity of the first heat conductive member is smaller than a thermal conductivity of the second heat conductive member.

8. The electronic component according to claim 7, wherein the second heat radiation portion has a higher heat dissipating capacity than a heat dissipating capacity of the first heat radiation portion.

* * * * *